US007602826B2

(12) United States Patent
Tomita et al.

(10) Patent No.: US 7,602,826 B2
(45) Date of Patent: Oct. 13, 2009

(54) SEMICONDUCTOR LASER MODULE, SEMICONDUCTOR LASER, AND METHOD OF ASSEMBLING THE SAME

(76) Inventors: Isao Tomita, c/o NEC Corporation, 7-1, Shiba 5-chome, Minato-ku, Tokyo (JP); Taro Kaneko, c/o NEC Corporation, 7-1, Shiba 5-chome, Minato-ku, Tokyo (JP)

( * ) Notice: Subject to any disclaimer, the term of this patent is extended or adjusted under 35 U.S.C. 154(b) by 0 days.

(21) Appl. No.: 11/871,043

(22) Filed: Oct. 11, 2007

(65) Prior Publication Data
US 2008/0112446 A1    May 15, 2008

(30) Foreign Application Priority Data
Nov. 14, 2006   (JP)   .............................. 2006-308202

(51) Int. Cl.
*H01S 3/04* (2006.01)
*H01S 5/00* (2006.01)
(52) U.S. Cl. .................... 372/34; 372/36; 372/43.01
(58) Field of Classification Search .............. 372/43.01, 372/34, 36
See application file for complete search history.

(56) References Cited
U.S. PATENT DOCUMENTS 5,210,650 A * 5/1993 O'Brien et al. ............. 359/820
5,604,832 A * 2/1997 Hall et al. .................... 385/89
5,640,407 A * 6/1997 Freyman et al. ............. 372/36
6,568,864 B1 * 5/2003 Ishimaru ..................... 385/93
6,845,121 B2 * 1/2005 McDonald ................... 372/34
2003/0044132 A1 * 3/2003 Nasu et al. ................... 385/92
2008/0095499 A1 * 4/2008 Oda et al. .................... 385/52

FOREIGN PATENT DOCUMENTS

| JP | 5210026 | 8/1993 |
| JP | 2003057467 | 2/2003 |

* cited by examiner

*Primary Examiner*—Minsun Harvey
*Assistant Examiner*—Phillip Nguyen

(57) ABSTRACT

The present invention aims to provide a miniaturized optical laser module that eliminates shift in contacting surfaces when contacting and fixing with adhesive two element carriers respectively holding an optical element and obtains a smooth adhesion fixation. A semiconductor laser module that has a configuration in which the element carriers respectively arranged with optical elements for laser oscillation are contacted and securely attached to each other to optically connect the optical elements and form a semiconductor laser, and externally outputs a laser light to an optical fiber arranged in advance via an optical system; where collar parts for setting contacting areas to an enlarged state when contacting the element carriers and being removably configured are integrally arranged on each element carrier on both side end faces at a contacting surface of each element carrier.

8 Claims, 10 Drawing Sheets

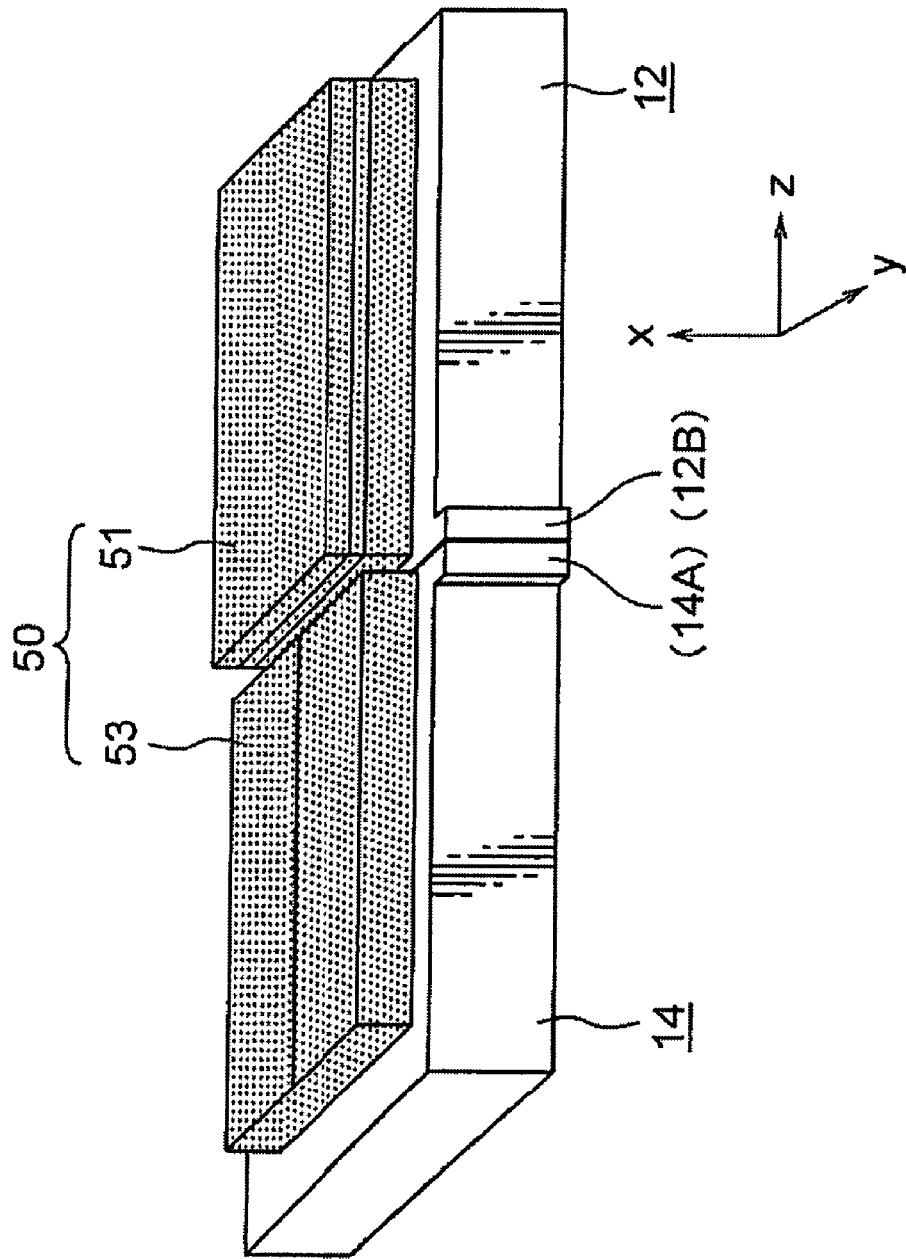

SEMICONDUCTOR LASER MODULE, SEMICONDUCTOR LASER, AND METHOD OF ASSEMBLING THE SAME

CROSS-REFERENCE TO RELATED APPLICATIONS

This application is based upon and claims the benefit of priority from Japanese patent application No. 2006-308202, filed on Nov. 14, 2006, the disclosure of which is incorporated herein in its entirety by reference.

BACKGROUND OF THE INVENTION

1. Field of the Invention

The present invention relates to semiconductor laser modules, in particular, to a semiconductor laser module configured by forming a resonator configuration with an optical amplifier and an optical waveguide, a semiconductor laser, and a method of assembling the same.

2. Description of the Related Art

Recently, optical communication modules such as optical semiconductor laser module and light receiving module are becoming more and more miniaturized with higher speed and larger capacity of the optical communication system. Accompanied therewith, optical elements such as semiconductor laser, optical filter, optical lens etc. are also becoming miniaturized.

Under such conditions, a method (hereinafter referred to as "active alignment") of aligning the optical axis to an optimum position while discharging or transmitting light from the optical element is generally widely used when mounting the optical element. When performing active alignment, a method of fixing the optical element on a ceramic plate called carrier, and aligning the optical axis while moving the carrier so that three axes position of X, Y, Z and three angles of $\theta X$, $\theta Y$, $\theta Z$ become optimum is adopted.

In the case of an external resonator laser module in which the external resonator configuration is formed with the optical amplifier and the optical waveguide to serve as the optical element, high precision active alignment is necessary to obtain a desired optical output while suppressing coupling loss and to obtain a stable laser oscillation while suppressing reflection. Furthermore, since the optical elements are enclosed in an air tight package for use in the usual module, the optical system is required to be fixed in a high precision active aligned state in the external resonator laser described above.

Fixation with adhesive that enables fixation at higher precision than fixation by YAG laser is more frequently used to suppress increase in coupling loss caused by axial shift and angular shift in time of fixation. A combination of the optical amplifier and the optical waveguide has been used in the above description, but the combination is not limited thereto, and it is also applicable when active aligning the coupling between the laser element and the waveguide element.

FIG. 8 shows a semiconductor laser module 100 of the external resonator configuration. In this example, a resonator configuration is configured by an optical amplifier 51 and an optical waveguide 53 to form the semiconductor laser 50. In this case, the optical system is required to be fixed in a high precision active aligned state. The fixation with adhesive, with which the shift in optical axis in time of fixation is small, is frequently used. That is, in the semiconductor laser module 100 shown in FIG. 8, element carriers 52, 54 holding the optical amplifier 51 and the optical waveguide 53, respectively, are aligned to the optimum position, and the element carriers 52, 54 are fixed with adhesive in an abutted state. FIG. 9 shows a state in which the element carriers are fixed with adhesive in the abutted state. Reference numeral 55 indicates a contacting part of the element carriers 52, 54.

As shown in FIG. 8, the element carriers 52, 54 are arranged on a Peltier cooler 56 having a cooling function, so that the temperature of the optical amplifier 51 and the optical waveguide 53 is temperature controlled at a level of $\frac{1}{100}$ [° C.]. The laser light output from the optical amplifier 51 is output towards an external optical fiber 57 via an optical system 58. The optical system 58 includes a first micro-lens 58A fixed and arranged on the element carrier 52 that holds the optical amplifier 51, and a second micro-lens 58B arranged inside a connecting part 59 for connecting the optical fiber 57.

In FIG. 8, reference numeral 60 indicates a case main body. A sealing lid is arranged on the upper surface of the case main body 60. Reference numeral 60a is a pass-through hole formed in correspondence to the connecting part 59 of the case main body 60, and defines a space for laser passage between the first and second micro-lenses 58A, 58B.

The first micro-lens 58A collimates the laser light discharged from the optical amplifier 51. The collimated light is collected at the second micro-lens 58B, and entered to the optical fiber 57. The Peltier cooler 56 temperature controls the entire module, thereby ensuring stable laser oscillation.

A conventionally known optical coupling device (patent documents 1 and 2) similar in technical matter with the present invention will now be described in addition to the example of FIG. 8 described above.

In the example disclosed in Japanese Laid-Open Patent Publication No. 2003-57467 (patent document 1), the semiconductor laser and the optical fiber are optically coupled using the optical waveguide, where a portion holding the fiber is integrally molded with a rising part of an L-shaped holding member (hard member), and a bottom part of the L-shaped holding member is formed with a cut-out for the optical waveguide from the end part towards the central part. The relevant example has features in that the optical waveguide is arranged and securely attached to the cut-out, the semiconductor laser is attached to the end part side of the optical waveguide, and a core for optically coupling an active layer of the semiconductor laser and the optical fiber is arranged on the optical waveguide, thereby forming the optical waveguide module.

In the example disclosed in Japanese Laid-Open Patent Publication No. 5-210026 (patent document 2), a block for the optical waveguide (optical waveguide block) is attached to the end of each optical fiber when coupling the optical fibers by way of the optical waveguide, and the optical waveguide block is partially welded and integrated with the YAG laser by way of the optical waveguide, thereby forming the coupling configuration of the optical fiber.

In the example shown in FIG. 8 described above, the element carrier 52 and the element carrier 54 are aligned to the optimum position and fixed with adhesive in an abutted state. Thus, if the abutting force is weak, the adhering surfaces of the two element carriers do not closely contact and optimum alignment cannot be performed, and furthermore, variation in thickness of the adhesive occurs thereby causing shift in optical axis after fixation. The abutting force thus is required to be strong.

If the area of the abutting surfaces of the element carriers is narrow, however, stress in the bending direction with one point or one side of the abutting surface as the supporting point is generated when the abutting surfaces are even slightly non-parallel in abutment, and shift further occurs in the bending direction the stronger the abutting force, whereby optimum alignment cannot be performed.

For instance, as shown in FIG. 10, if the element carriers 52, 54 having a small size of about 1-2 [mm] of about the same as the optical amplifier 51 and the optical waveguide 53, which are optical elements, are used, the element carriers tilt when subjected to the stress in the bending direction in time of abutment, whereby the coupling loss increases and the desired optical output cannot be obtained, or the reflection at the end face increases and a stable oscillation state cannot be obtained. The symbol a indicates the tilt angle in this case. When an element carrier including a large contacting area is used to alleviate the stress in the bending direction, the size of the element carrier increases and the package size for enclosing the same increases, and thus is not suited for miniaturizing the module.

In the example shown in patent document 1, the entire side surface of the optical waveguide for holding the semiconductor laser is further held by the L-shaped holding member (hard member), and thus the L-shaped holding member is largely arranged on the side surface of the optical waveguide, whereby the durability of the device strengthens but the entire device enlarges and general versatility tends to lack.

Furthermore, in the example shown in patent document 2, the optical waveguide block with a relatively large contacting surface is arranged on both optical fibers by way of the optical waveguide, and the optical waveguide block and the optical waveguide are partially welded and integrated with YAG laser when coupling the optical fibers by way of the optical waveguide, whereby the entire device enlarges and general versatility tends to lacks, and furthermore, problem arises in terms of durability of the welded portion.

SUMMARY OF THE INVENTION

It is an exemplary object of the present invention to provide a miniaturized optical laser module in which shift in the contacting surfaces when abutting and fixing two element carriers with adhesive is effectively eliminated so that stress in the bending direction at the contacting surface of the two element carriers is alleviated and the two element carriers are abutted and smoothly fixed with adhesive, and a method of assembling the same.

In order to achieve the above aim, it is an exemplary aspect of the present invention to provide a semiconductor laser module including a semiconductor laser that oscillates laser light configured by arranging one element carrier which includes one optical element for laser oscillation arranged on an upper surface and another element carrier which includes another optical element for laser oscillation arranged on an upper surface, and contacting and securely attaching the element carriers to each other to optically connect the optical elements, the laser light being transmitted to an optical fiber arranged in advance via an optical system; where collar parts for setting contacting areas to an enlarged state when contacting the element carriers and being removably configured are integrally arranged on each element carrier on both side end faces at a contacting surface of each element carrier.

Therefore, the area of the contacting surface when butting and fixing the two element carriers with adhesive is significantly enlarged compared to the related art by the contacting surface enlarging function essentially provided by the collar parts, whereby shift etc. in the contacting surface that easily occurs in time of contact can be effectively suppressed, and generation of stress in the bending direction at the contacting surfaces of the two element carriers is effectively suppressed so that the two element carriers can be butted and smoothly adhesion fixed, and furthermore, since the collar parts are removable, miniaturization can be maintained similar to the related art by removing the collar parts when incorporating the two element carriers in the case main body.

Another exemplary aspect of an optical laser module semiconductor laser of the present invention relates to a semiconductor laser configured by arranging element carriers respectively including an optical element for laser oscillation arranged on an upper surface, and butting, contacting and securely attaching the element carriers to each other to optically connect the optical elements; where collar parts for setting contacting areas to an enlarged state when contacting the element carriers and being removably configured are integrally arranged on each element carrier at least on both side end faces at a contacting surface of each element carrier.

Therefore, the area of the contacting surface when butting and fixing the two element carriers with adhesive is significantly enlarged compared to the related art by the function of the collar parts, whereby shift etc. in the contacting surface that easily occurs in time of contact can be effectively suppressed, so that the two element carriers can be butted and smoothly adhesion fixed to obtain an optical laser module semiconductor laser having satisfactory durability A method of assembling a semiconductor laser module according to the present invention includes an element carrier preparation step of arranging one element carrier holding an optical amplifier, which is one optical element for laser oscillation, on an upper surface, and another element carrier holding an optical waveguide, which is another optical element for laser oscillation, on an upper surface; and a semiconductor laser assembly step of contacting and securely attaching the element carriers with adhesive to coincide the optical axes of each optical element and optically couple the optical elements to configure a semiconductor laser.

A collar part forming step is provided as a pre-step of the element carrier preparation step to integrally form collar parts for setting contacting areas to an enlarged state when contacting the element carriers on each element carrier on at least both side end faces of the contacting surface of each element carrier, and furthermore, a collar part removing step is provided as a post-step of the semiconductor laser assembly step described above to remove the collar parts from the element carriers that are securely fixed and integrated.

Thus, in the semiconductor laser assembly step, the area of the contacting surface when butting and fixing the two element carriers with adhesive is significantly enlarged compared to the related art by the function of the collar parts, whereby shift etc. in the contacting surface that easily occurs in time of contact can be effectively suppressed, so that the two element carriers can be butted and smoothly adhesion fixed, and furthermore, since the element carriers are removed with collar parts through the collar part removing step and incorporated in the module, only the portion necessary for mounting the element remains, and thus the size of the element carrier can be reduced and the entire optical module can be miniaturized.

As an exemplary advantage according to the invention, the area of the contacting surface when butting and fixing the two element carriers with adhesive is significantly enlarged compared to the example described above due to the arrangement of the collar parts, whereby shift etc. in the contacting surface can be effectively eliminated, and generation of stress in the bending direction at the contacting surfaces of the two element carriers is effectively alleviated so that the two element carriers can be butted and smoothly adhesion fixed. Furthermore, since the collar parts are removable, an excellent effect is obtained, that is not obtained in the related art, of maintaining miniaturization similar to the example described above although a configuration in which the collar parts are arranged is adopted.

BRIEF DESCRIPTION OF THE DRAWINGS

The invention, together with objects and advantages thereof, may best be understood by reference to the following description of the exemplary embodiment together with the accompanying drawings in which:

FIG. 4 is an explanatory view showing a contacting state of the two element carriers and the collar parts shown in FIG. 3, where

FIG. 5 is a view related to the front view of FIG. 4C and is a perspective view showing two contacted element carriers with the collar parts removed;

FIG. 7 is an explanatory view showing a contacting state of the two element carriers and the collar parts shown in FIG. 6, where

EXEMPLARY EMBODIMENT

Figure 1:
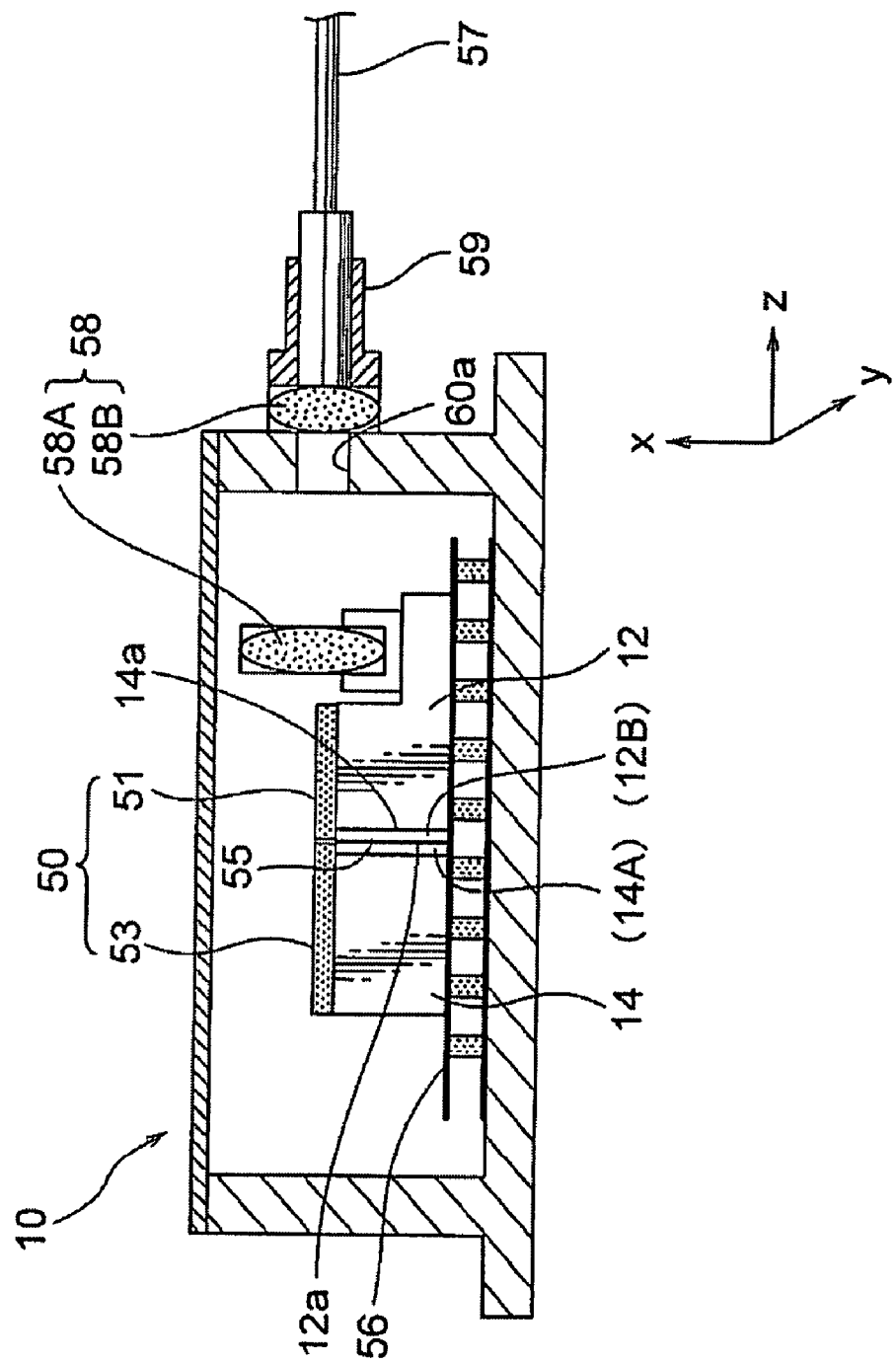
FIG. 1 is a schematic configuration view showing one exemplary embodiment of the present invention.

One exemplary embodiment of the present invention will now be described based on FIGS. 1 to 7. Same reference numerals are used for the constituting members same as in the related art described above.

(Overall Configuration)

FIG. 1 shows an optical laser module (semiconductor laser module) 10 equipped with a semiconductor laser 50 configured by two optical elements of an optical amplifier 51 and an optical waveguide 53. The semiconductor laser 50 is an external resonator laser that has a resonator configuration between the optical amplifier 51 and the optical waveguide 53, and obtains laser oscillation. Thus, the optical amplifier 51 and the optical waveguide 53 require high precision mounting. The optical amplifier 51 and an element carrier 12 are soldering fixed. Similarly, the optical waveguide 53 and an element carrier 14 are soldering fixed.

The element carrier 12 and the element carrier 14 has collar parts 12A, 12B; 14A, 14B on both sides, so that the area of the butting portion is widened. Furthermore, removing parts 12Ab and 12Bb serving as cut-outs are formed entirely in the collar parts 12A, 12B; 14A, 14B and have a shape that can be cut and easily removed after adhesion assembling.

This will be further described in detail below.

As shown in FIG. 1, the semiconductor laser module 10 according to the present exemplary embodiment includes one element carrier 12 with the optical amplifier 51, which is one optical element for laser oscillation, mounted on the upper surface, and the other element carrier 14 including the optical waveguide 53, which is another optical element for laser oscillation, mounted on the upper surface, where the element carriers 12, 14 are contacted to each other and securely attached with an adhesive so that the optical elements 51, 53 are optically connected. The semiconductor laser 50 that oscillates laser light is assembled and mounted on the element carriers 12, 14. The output of the semiconductor laser 50 is output to the optical fiber 57 arranged in advance via the optical system 58.

A Peltier cooler 56 serving as a cooling device for integrally cooling each element carrier 12, 14 is attached to each element carrier 12, 14 described above. Therefore, temperature control is effectively performed targeting on the entire module, and a stable laser oscillation is ensured.

Figure 2:
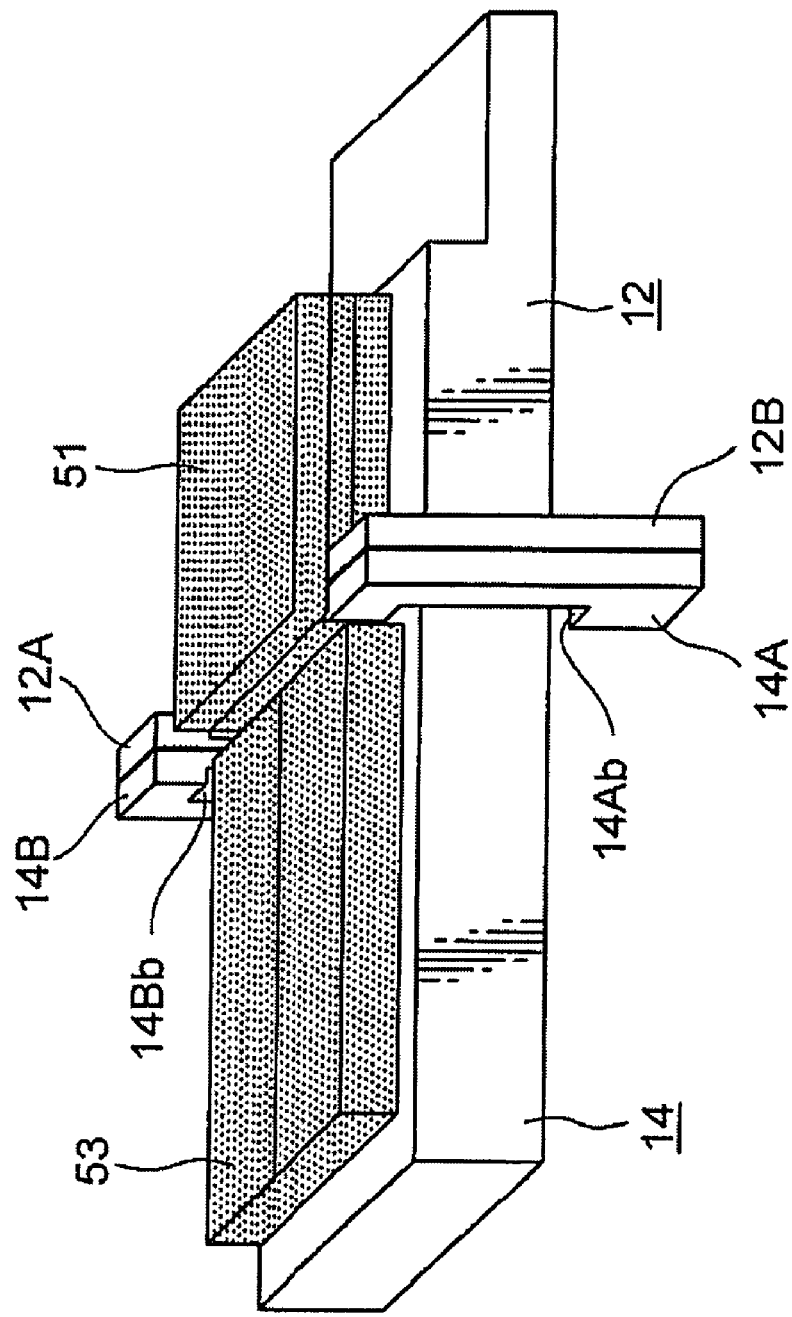
FIG. 2 is a schematic perspective view of FIG. 1 showing a contacted and adhered state of the collar parts and the two element carriers.
Figure 3:
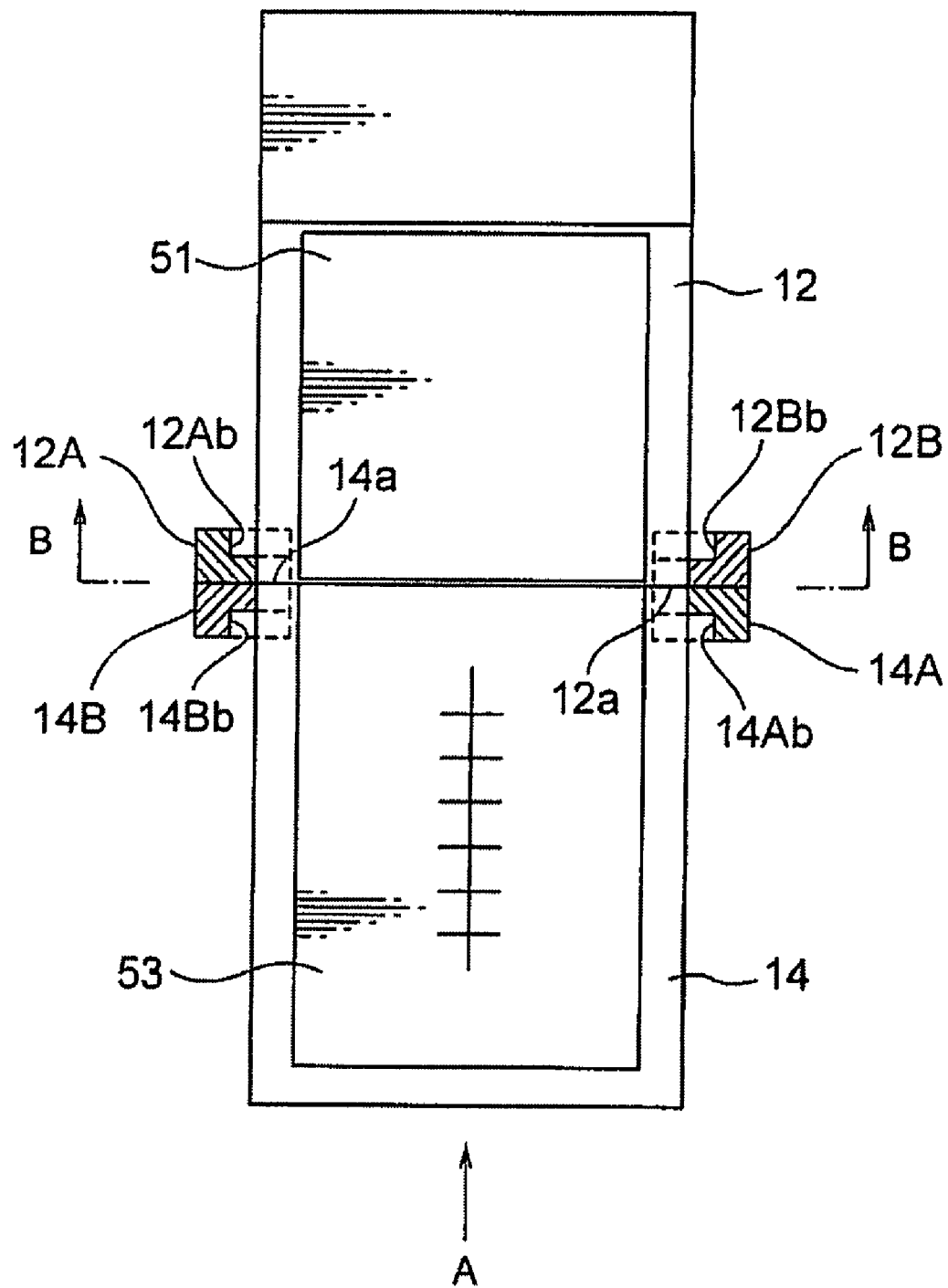
FIG. 3 is a plan view of a partial cross section of FIG. 2.

As shown in FIGS. 2 to 4, the collar parts 12A, 12B, 14A, and 14B for setting the contacting area to an enlarged state when contacting each element carrier 12, 14 and being removably configured are integrally attached to each element carrier 12, 14 on both side end faces at a contacting surface 55 of the element carriers 12, 14. In FIG. 1 described above, the remaining parts (12B) (14A) after the collar parts 12A, 12B, 14A, 14B are removed are shown. This is the same in FIG. 5 to be hereinafter described.

Figure 4A:
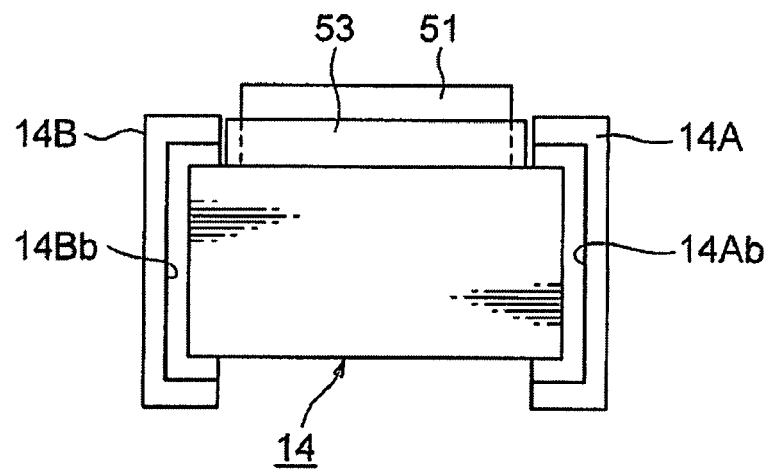
FIG. 4A shows a front view of the two element carriers of FIG. 3 seen from direction A.
Figure 4B:
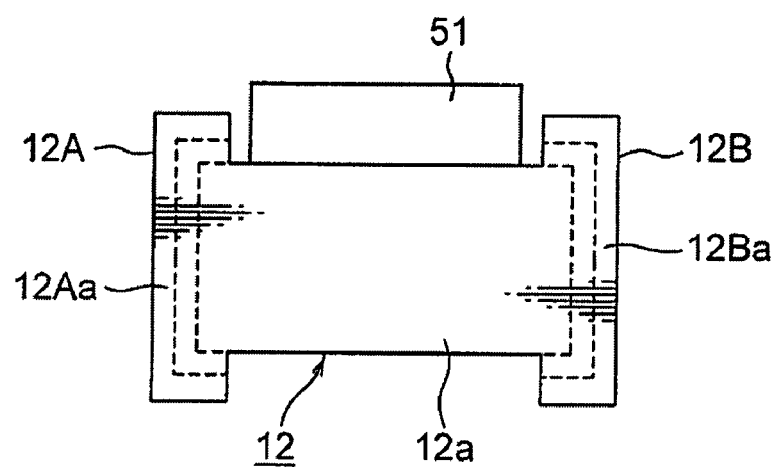
FIG. 4B is a cross sectional view (end face view before adhesion) taken along line B-B of FIG. 3.

FIG. 2 shows a state in which the element carriers 12, 14 are contacted to each other and adhered with adhesive. FIG. 3 shows a plan view of the portion of each element carrier 12, 14 in a state adhered with adhesive. In FIG. 3, the collar part 12A, 12B, 14A, 14B portions are illustrated in a traverse cross sectional state. Furthermore, FIG. 4A shows a front view of FIG. 3 seen from direction A, and FIG. 4B shows a cross sectional view (end face view before adhesion) taken along line B-B of FIG. 3.

Figure 4C:
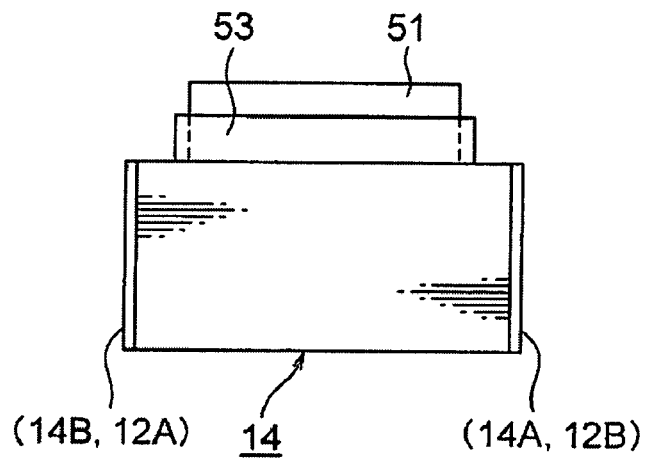
FIG. 4C is a front view showing a state when the collar parts are removed after contacting the two element carriers shown in FIG. 3.

Moreover, FIG. 4C shows one example in which the collar part 12A, 12B, 14A, and 14B portions are removed. FIG. 5 shows a perspective view of FIG. 4C.

Each collar part 12A, 12B, 14A, and 14B has a thick plate form that is formed into a horseshoe shape overall so as to grip the side end face of each element carrier 12, 14, and the respective contacting surface has a flat surface overall. The contacting surfaces 12Aa, 12Ba of the collar parts 12A, 12B are shown in FIG. 4B. The contacting surfaces 12Aa, 12Ba of the collar parts 12A, 12B form the same plane as the contacting surface 12a of the element carrier 12 described above. Thus, a state in which the contacting surface 12a of the element carrier 12 is substantially enlarged is obtained.

The contacting surfaces of each collar parts 14A, 14B are configured similar to that of the collar parts 12A, 12B, and thus also form the same plane as the contacting surface of the element carrier 14. Thus, a state in which the contacting surface 14a of the element carrier 14 is substantially enlarged is obtained in correspondence to the contacting surface 12a of the element carrier 12.

The removing parts 12Ab, 12Bb serving as cut-outs are formed uniformly along the element carrier 12 at a region on the back side of the contacting surfaces 12Aa, 12Ba of the collar parts 12A, 12B and connected to the element carrier 12. In other words, the thickness on the side connecting to the element carrier 12 is formed uniformly thinner than the thickness on the outer peripheral side thereof by the removing parts 12Ab, 12Bb in each collar parts 12A, 12B. Thus, the collar parts 12A, 12B have shapes that can be easily removed after the element carriers 12, 14 are contacted and assembled.

Each collar part 14A, 14B is also formed with removing parts 14Ab, 14Bb similar to each collar part 12A, 12B, whereby the collar parts 14A, 14R have shapes that can be easily removed after the element carriers 12, 14 are contacted and assembled.

Other configurations and effects thereof are the same as the related art previously described.

(Assembly Method)

The method of contacting and assembling the element carriers 12, 14 (setting of semiconductor laser 50) in the above exemplary embodiment will now be described.

First, one element carrier 52 holding the optical amplifier 51, which is one optical element for laser oscillation, on the upper surface, and the other element carrier 54 holding the optical waveguide 52, which is the other optical element for laser oscillation, on the upper surface are formed and prepared in advance (element carrier preparation step). In order to coincide the optical axes of the optical elements 51, 53 to optically connect the optical elements and configure the semiconductor laser 50, the element carriers 12, 14 are contacted while corresponding the collar parts 12A, 12B, 14A, 14B, to be hereinafter described, and securely attached with adhesive (semiconductor laser assembly step).

Specifically, in the semiconductor laser assembly step, the optical axes are aligned while moving the element carrier 12 and the element carrier 14 so that the three axes position of X, Y, and Z and three angles of θX, θY, θZ become optimum by using the assembly device (not shown), and the contacting surfaces 12a, 14a of each element carrier 12, 14 are butted to each other and fixed with adhesive.

In this case, the collar parts 12A, 12B, 14A, 14B to be hereinafter described also exert the contacting function along with the contacting surfaces 12a, 14a of each carrier element 12, 14.

A pre-step of the element carrier preparation step is provided in the present exemplary embodiment, in which pre-step, the collar parts 12A, 12B; 14A, 14B for setting the contacting areas to an enlarged state when contacting the element carriers are integrally formed on each element carrier 12, 14 at both side end faces (same plane) of the contacting surfaces 12a, 14a of the element carriers 12, 14 (collar part forming step).

The contacting surfaces 12a, 14a of each carrier 12, 14 are then in an enlarged state, so that even if shift etc. occurs, the influence thereof is effectively alleviated and contact and adhesion are carried out in a stable state.

That is, in the example described above, if the area of the contacting surfaces 12a, 14a (butting surface) of the element carriers 12, 14 is narrow, stress in the bending direction is generated with one point or one side of the butting surface as the supporting point when the butting surfaces are even slightly non-parallel when butting, whereby shift advances in the bending direction as the butting force becomes stronger. In the exemplary embodiment, however, the collar parts 12A, 12B; 14A, 14B effectively function to obtain a state in which the contacting surfaces 12a, 14a of the element carriers 12, 14 are substantially enlarged, and thus the above described disadvantage can be effectively improved.

As a post-step of the semiconductor laser assembly step described above, a step of removing the collar parts 12A, 12B; 14A, 14B from the element carriers 12, 14 securely attached and integrated in the collar part formation step is provided (collar part removing step). FIG. 4C shows a view of after the collar parts 12A, 12B; 14A, 14B are removed. FIG. 5 is a perspective view of FIG. 4C. The element carriers 12, 14 from which the collar parts 12A, 12B, 14A, 14B are removed through the collar part removing step are arranged in a case main body 60 with the Peltier cooler 56 described above, as shown in FIG. 1.

Therefore, in the present exemplary embodiment, the stress in the bending direction having one point or one side in the butting surface as the supporting point when butting and fixing the two element carriers 12, 14 with adhesive is effectively alleviated by the contacting surface enlarging function of the collar parts 12A, 12B; 14A, 14B, and the collar parts 12A, 12B; 14A, 14B are removed after the two element carriers 12, 14 are butted and fixed with adhesive, whereby an element carrier that enables miniaturized mounting is realized.

The optical axes are aligned while being moved so that the three axes position of X, Y, Z and three angles of θX, θY, θz formed in this case become optimum, but since the contacting areas of the two element carriers 12, 14 are substantially widened by the collar parts 12A, 12B; 14A, 14B when butting and fixing the element carriers with adhesive in the Z direction, as described above, the stress in the bending direction having one point or one side in the butting surface as the supporting point is alleviated and the thickness of the adhesive can be evened, whereby fixation can be performed at an optimally optical axis aligned position, increase in coupling loss and reflection of end face can be suppressed, and desired light output and stable laser oscillation can be achieved.

If the collar parts 12A, 12B; 14A, 14B are cut at the position of the cut-outs after adhesion fixation as in FIG. 4, only the portion necessary for mounting the element remains when mounting to the case main body 60, and as a result, the size of the element carriers 12, 14 can be reduced and the entire optical module can be miniaturized.

(Another Exemplary Embodiments)

Figure 6:
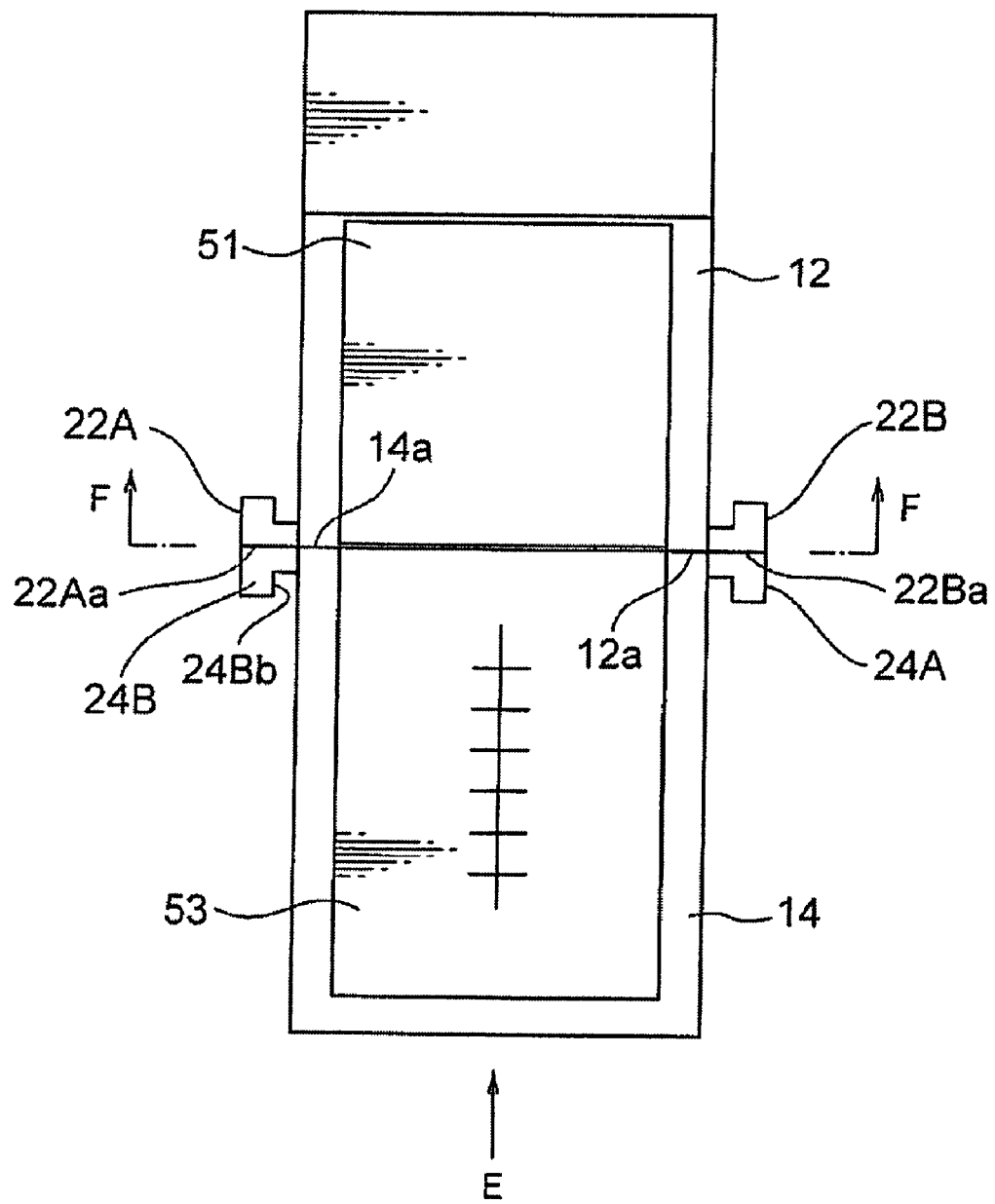
FIG. 6 is a plan view showing another example of the collar part shown in FIG. 3.

Another exemplary embodiments will be shown in FIGS. 6 and 7. Same reference numerals are used for the constituting members same as in the exemplary embodiment of FIGS. 1 to 5 described above.

In another exemplary embodiment shown in FIGS. 6 and 7, collar parts 22A, 22B; 24A, 24B include each contacting surface 22Aa, 22Ba; 24Aa, 24Ba forming a flat surface and have a cross section of an L-shape, thereby forming a shape of a rectangular column shape as a whole.

The collar parts 22A, 22B; 24A, 24B formed to have a cross section of L-shape include the contacting surface on the exterior side forming the same plane as the contacting surfaces 12a, 14a on the exterior side of the element carriers 12, 14.

Simultaneously, the collar parts 22A, 22B; 24A, 24B have the thickness on the side connecting with the element carriers 12, 14 formed uniformly thinner than the thickness on the outer side thereof. In other words, one part of the quadratic prism shape is removed to form a cross section of L-shape, and a configuration same as when the thickness on the side connecting with the element carriers 12, 14 is formed uniformly thinner than the thickness on the outer peripheral side thereof is obtained. Thus, each collar part 22A, 22B; 24A, 24B is in a state the element carrier 12, 14 side can be easily removed, similar to each collar part 12A, 12B; 14A, 14B in the exemplary embodiment of FIGS. 1 to 5 described above.

Figure 7A:
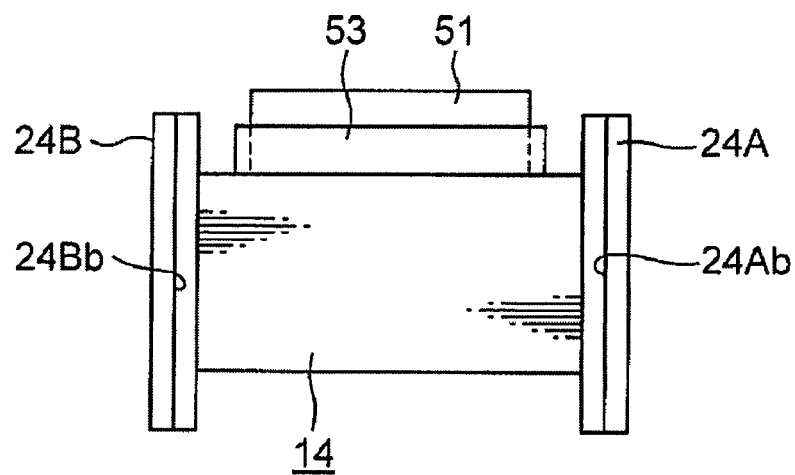
FIG. 7A shows a front view of the two element carriers of FIG. 6 seen from direction E.
Figure 7B:
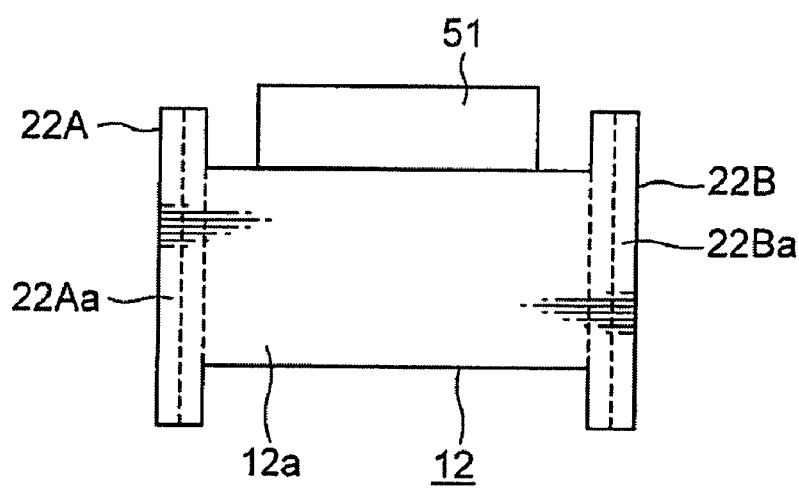
FIG. 7B is a cross sectional view (end face view before adhesion) taken along line F-F of FIG. 6.

FIG. 6 shows a plan view of a state in which each element carrier 12, 14 is contacted and adhered with adhesive in the present exemplary embodiment. FIG. 7A is a front view seen from direction E of FIG. 6, and FIG. 7B is a cross sectional view (end face view before adhesion) taken along line E-E of FIG. 6.

Figure 7C:
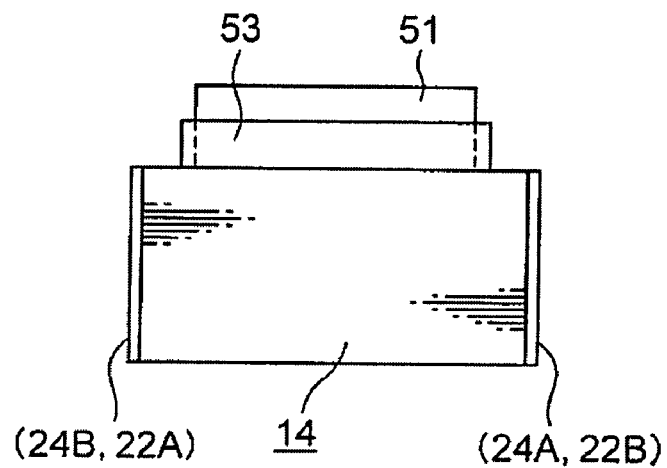
FIG. 7C is a front view showing a state when the collar parts are removed after contacting the two element carriers shown in FIG. 6.
Figure 8:
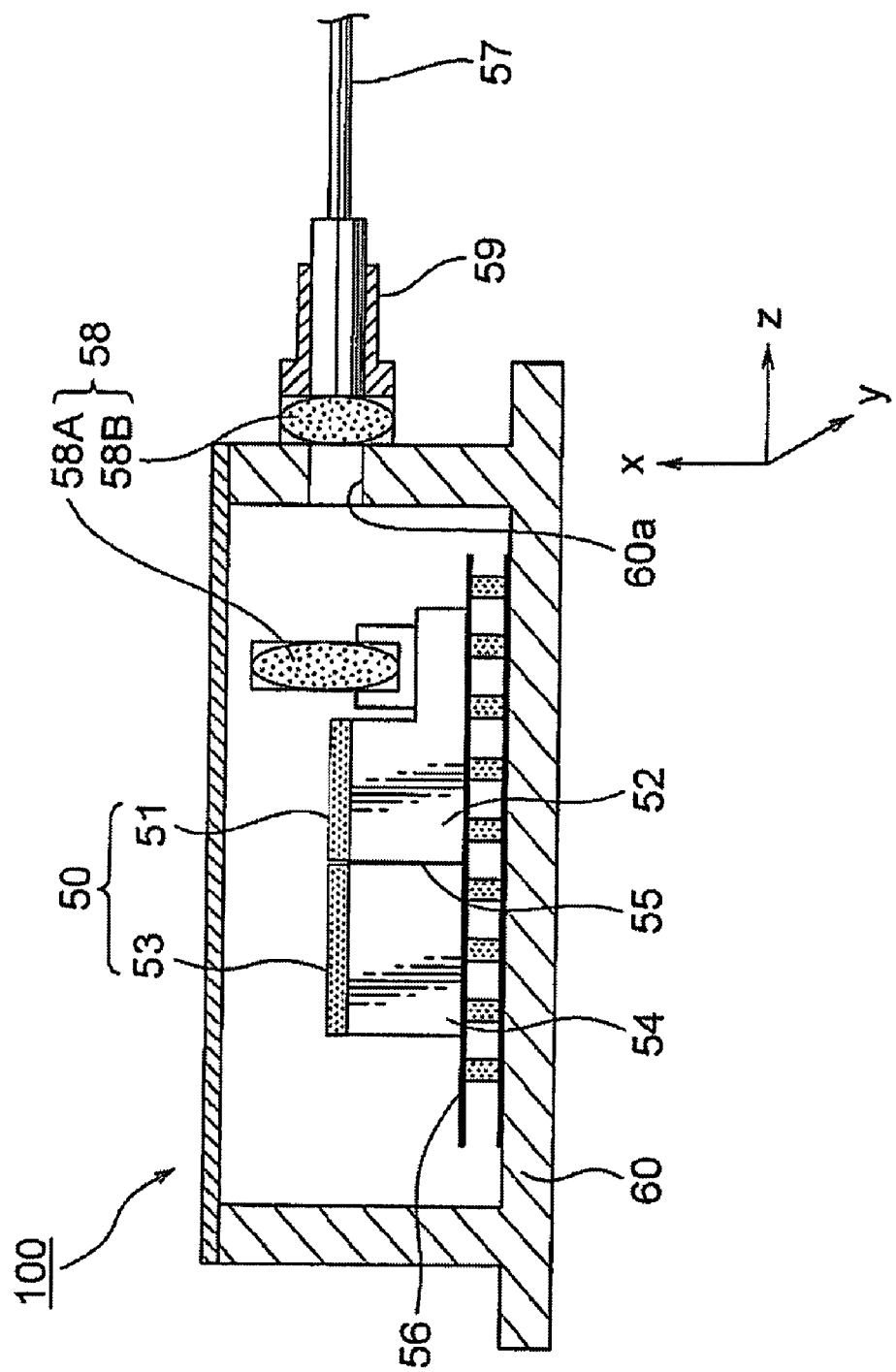
FIG. 8 is a schematic explanatory view showing a related example.
Figure 9:
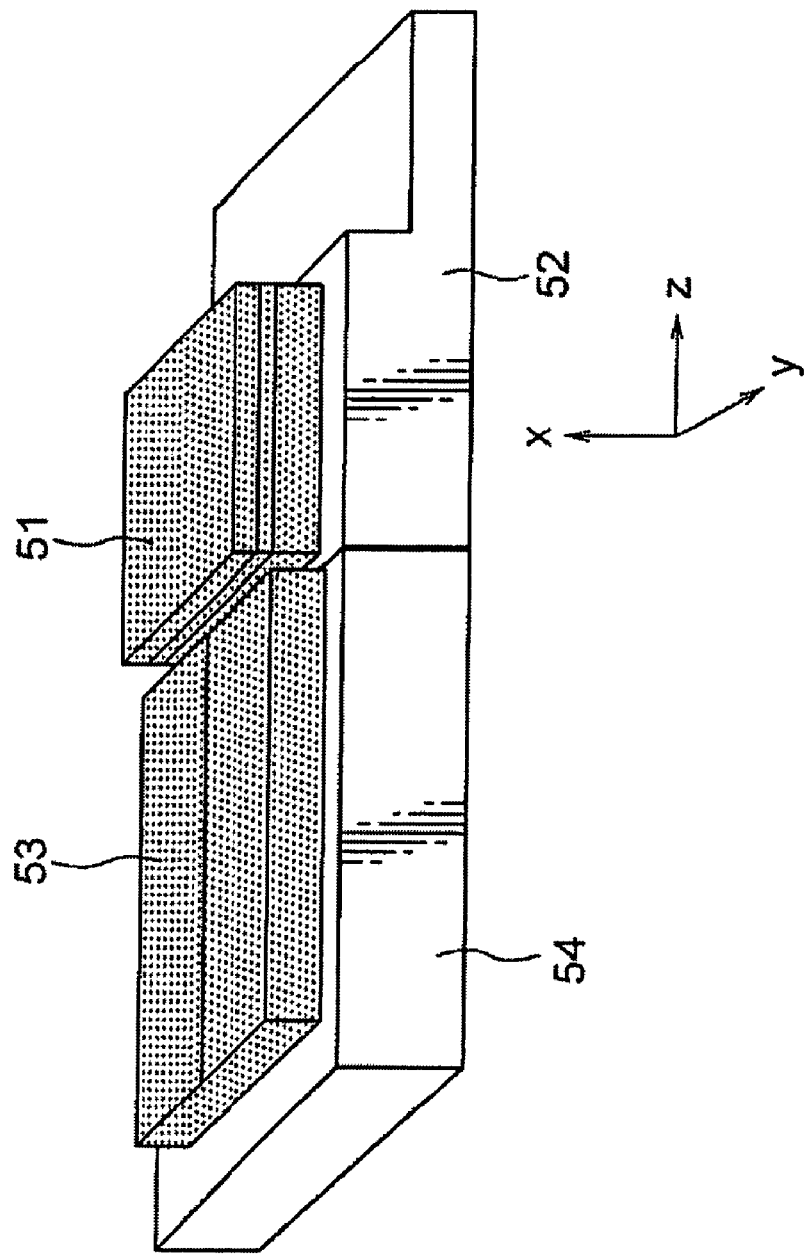
FIG. 9 is a schematic perspective view showing two element carrier portions in FIG. 8.
Figure 10:
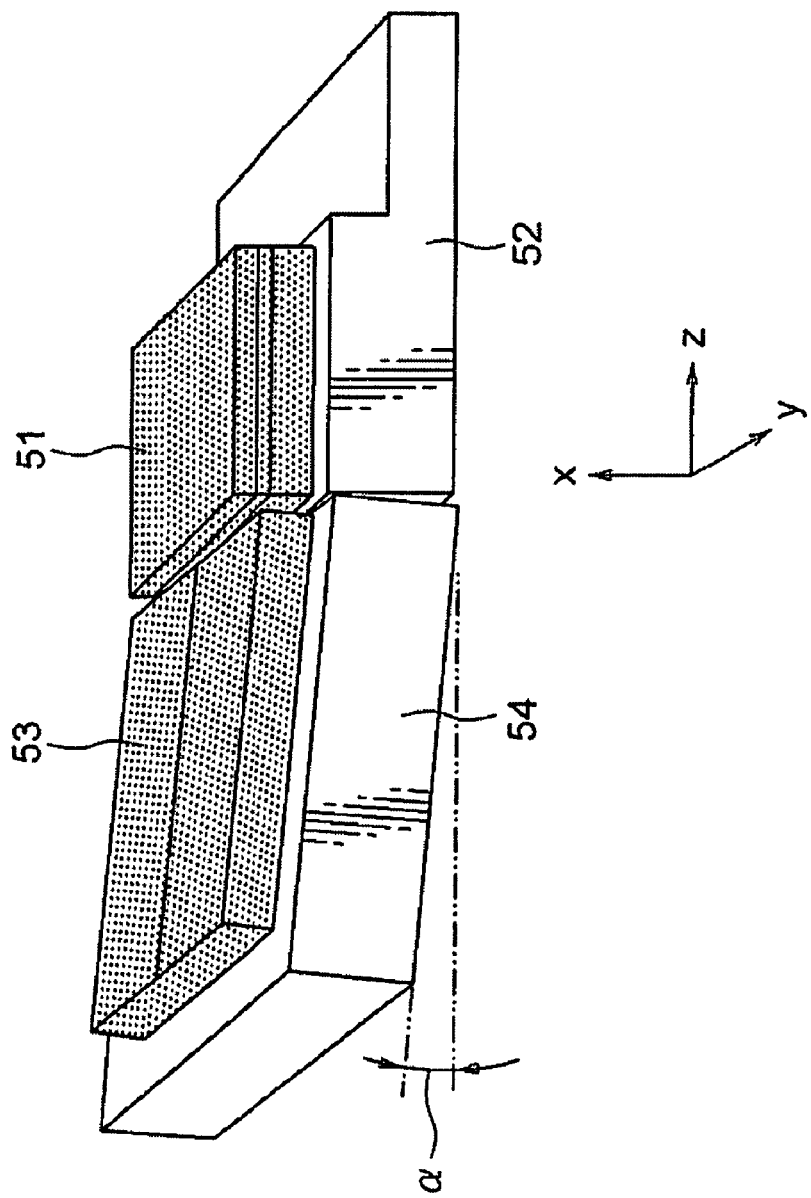
FIG. 10 is an explanatory view showing an example of a disadvantage that occurs in time of adhesion in the example shown in FIG. 9.

FIG. 7C shows one example of when the collar parts 12A, 12B, 14A, 14B portions are removed. In this exemplary embodiment the perspective view of FIG. 7C is exactly the same as the perspective view of FIG. 5, similar to the exemplary embodiment of FIGS. 1 to 5 described above.

The correspondence relationship and the operation function of the element carriers 12, 14 and each collar part 22A, 22B; 24A, 24B in FIGS. 6 and 7 are exactly the same as in FIGS. 3 and 4 described above. Other configurations and effects are the same as the exemplary embodiment of FIGS. 1 to 5.

Thus, the exemplary embodiment shown in FIGS. 6 and 7 has the effect same as the exemplary embodiment of FIGS. 1 to 5 described above, and in addition, has an advantage that productivity and handling are satisfactory since each collar part 22A, 22B; 24A, 24B is formed into a rectangular column shape, and cost can be reduced in regards to such aspect.

In each exemplary embodiment described above, the collar parts 12A, 12B; 14A, 14B (22A, 22B; 24A, 24B) are arranged as described above, and the area of the contacting surfaces 12a, 12a when butting and fixing the two element carriers 12, 14 with adhesive are substantially enlarged compared to the related art, whereby the shift in the contacting surface 12a, 12 can be effectively suppressed, the stress in the bending direction in the contacting surfaces 12a, 14a of the two element carriers 12, 14 is effectively alleviated, and the two element carriers 12, 14 can be butted and smoothly adhered and fixed.

Moreover, the collar parts 12A, 12B; 14A, 14B can be easily removed, and in regards to such aspect, an excellent semiconductor laser module, semiconductor laser, and method of assembling the same are proposed, which are not proposed in the related art, of maintaining miniaturization similar to the previously described example although a configuration in which the collar parts 12A, 12B; 14A, 14B are arranged is adopted.

Other exemplary embodiments of the present invention will now be described.

A cooling device for integrally cooling each element carrier may be attached to each element carrier. A stable laser oscillation is thereby ensured.

The collar part may have a thick plate shape and formed into a horseshoe shape to grip the side end face of each element carrier. The collar part formed into a horseshoe shape may be configured so that the contacting surface on the exterior side forms the same plane as the contacting surface on the exterior side of the element carrier. Moreover, the collar part may have the thickness on the side connecting with the element carrier formed uniformly thinner than the thickness on the outer peripheral side thereof.

Instead of forming the collar part into a horseshoe shape, the shape of the collar part may be such in which the contacting surface is a flat surface and the cross section is an L-shape so as to be formed into a rectangular column shape overall.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A semiconductor laser module comprising:
a semiconductor laser to output a laser light, the semiconductor laser comprising one or more optical elements to oscillate the laser light;
one or more element carriers, each element carrier to support a corresponding optical element of the semiconductor laser, the corresponding optical element of each element carrier directly disposed on the element carrier, each element carrier having one or more contact surfaces; and
a connecting member comprising one or more collar parts, each collar part having a first part fixably attached to a corresponding contact surface of a corresponding element carrier and a second part removably attached to the first part,
wherein the second part of each collar part is adapted to effectively increase a surface area of the corresponding contact surface of the corresponding element carrier upon the second part being attached to the first part.

2. The semiconductor laser module according to claim 1, wherein each element carrier is arranged with a cooling device for integrally cooling each element carrier.

3. The semiconductor laser module according to claim 1, wherein the collar part has a thick plate shape and formed into a horseshoe shape to grip a side end face of each element carrier.

4. The semiconductor laser module according to claim 3, wherein the collar part formed to the horseshoe shape has a contacting surface on the exterior side forming a same plane as the contacting surface on the exterior side of the element carrier.

5. The semiconductor laser module according to claim 3, wherein the collar part has a thickness on a side connecting with the element carrier made uniformly thinner than the thickness on an outer peripheral side.

6. The semiconductor laser module according to claim 3, wherein the collar part is a collar part formed into a rectangular column shape overall with a contacting surface formed to a flat surface and a cross section formed to an L-shape instead of the collar part formed into the horseshoe shape.

7. A connecting member for a semiconductor laser of an optical laser module, the semiconductor laser having one or more optical elements to oscillate laser light output by the semiconductor laser, the optical laser module having one or more element carriers, each element carrier to support a corresponding optical element of the semiconductor laser, the corresponding optical element of each element carrier directly disposed on the element carrier, each element carrier having one or more contact surfaces, the connecting member comprising:
one or more collar parts, each collar part having a first part fixably attached to a corresponding contact surface of a corresponding element carrier and a second part removably attached to the first part,
wherein the second part of each collar part is adapted to effectively increase a surface area of the corresponding contact surface of the corresponding element carrier upon the second part being attached to the first part.

8. A method of assembling a semiconductor laser module, the semiconductor laser module having a semiconductor laser, the semiconductor laser having one or more optical elements to oscillate laser light output by the semiconductor laser, the optical laser module having one or more element carriers, each element carrier to support a corresponding optical element of the semiconductor laser, each element carrier having one or more contact surfaces, the method comprising:

fixably attaching a first part of a collar part to a corresponding contact surface of a corresponding element carrier;
removably attaching a second part of the collar part to the first part of the collar part to effectively increase a surface area of the corresponding contact surface to ease assembly of the semiconductor laser module;

upon assembly of the semiconductor laser module, removing the second part of the collar part from the first part of the collar part such that the surface area of the corresponding contact surface is decreased.

* * * * *